United States Patent
Crouse et al.

(10) Patent No.: US 11,613,984 B2
(45) Date of Patent: Mar. 28, 2023

(54) DETERMINATION OF HYDROCARBON MOBILIZATION POTENTIAL FOR ENHANCED OIL RECOVERY

(71) Applicant: Dassault Systemes Simulia Corp., Johnston, RI (US)

(72) Inventors: Bernd Crouse, Brisbane, CA (US); Ganapathi Balasubramanian, Brisbane, CA (US)

(73) Assignee: Dassault Systemes Simulia Corp., Johnston, RI (US)

( * ) Notice: Subject to any disclaimer, the term of this patent is extended or adjusted under 35 U.S.C. 154(b) by 350 days.

(21) Appl. No.: 16/559,877

(22) Filed: Sep. 4, 2019

(65) Prior Publication Data
US 2021/0062638 A1    Mar. 4, 2021

(51) Int. Cl.
*E21B 47/003*    (2012.01)
*G06F 30/20*    (2020.01)
(Continued)

(52) U.S. Cl.
CPC ............ *E21B 47/003* (2020.05); *C09K 8/594* (2013.01); *E21B 43/168* (2013.01); *E21B 43/20* (2013.01); *G01V 99/005* (2013.01); *G06F 30/20* (2020.01)

(58) Field of Classification Search
CPC .... E21B 47/003; E21B 43/168; E21B 43/166; E21B 43/16; G06F 30/20; C09K 8/594;
(Continued)

(56) References Cited

U.S. PATENT DOCUMENTS 3,818,757 A    6/1974 Brown
5,594,671 A    1/1997 Chen et al.
(Continued)

FOREIGN PATENT DOCUMENTS

CN    102383783    6/2015
JP    2011191848    9/2011
(Continued)

OTHER PUBLICATIONS

Bao et al., "Lattice Boltzmann method for fluid simulations," Department of Mathematics, Courant Institute of Mathematical Sciences, New York University, Apr. 14, 2011, 44:1-16.
(Continued)

*Primary Examiner* — Catherine T. Rastovski
*Assistant Examiner* — Kaleria Knox
(74) *Attorney, Agent, or Firm* — Fish & Richardson P.C.

(57) ABSTRACT

Techniques including methods, apparatus and computer program products are disclosed for determining an amount of hydrocarbon recoverable from porous reservoir rock by a miscible gas flood. The techniques include retrieve a representation of a physical porous reservoir rock sample (porous reservoir rock), the representation including pore space and grain space data corresponding to the porous reservoir rock, subsequent to an execution of a multiphase flow simulation to obtain predictions of flow behavior of oil in the presence of a waterflood of the porous reservoir rock, locate substantially immobile oil blobs or patches in the retrieved representation of the porous reservoir rock; and for N number of substantially immobile oil blobs or patches (blobs), evaluate changes in mobility of the blobs for two or more iterations an effort level for of a given EOR technique, with a first one of the two or more iterations expending a first level of effort and a second one of the two or more iterations expending a second, higher level of effort, to estimate an amount of
(Continued)

change in mobilization of the blob between the first and the second iterations for the given EOR technique.

20 Claims, 9 Drawing Sheets

(51) Int. Cl.
   *C09K 8/594* (2006.01)
   *E21B 43/16* (2006.01)
   *E21B 43/20* (2006.01)
   *G01V 99/00* (2009.01)

(58) Field of Classification Search
   CPC .... C09K 8/584; G01V 99/005; A61K 31/713; C10G 1/045
   See application file for complete search history.

(56) References Cited

U.S. PATENT DOCUMENTS

| | | |
|---|---|---|
| 5,605,517 A | 2/1997 | Sherman |
| 5,848,260 A | 12/1998 | Chen et al. |
| 5,953,239 A | 9/1999 | Teixeira et al. |
| 6,318,156 B1 | 11/2001 | Dutton et al. |
| 6,516,080 B1 | 2/2003 | Nur |
| 6,915,245 B1 | 7/2005 | Hinton et al. |
| 6,928,399 B1 | 8/2005 | Watts et al. |
| 7,209,873 B1 | 4/2007 | Kliegel |
| 7,590,514 B1 | 9/2009 | Olovsson |
| 8,583,411 B2 | 11/2013 | Fung |
| 8,757,871 B2 | 6/2014 | Gruebele et al. |
| 9,228,873 B2 | 1/2016 | Crouse et al. |
| 10,101,188 B2 | 10/2018 | Crouse et al. |
| 10,550,690 B2 | 2/2020 | Crouse et al. |
| 2005/0182603 A1 | 8/2005 | Freitas et al. |
| 2006/0277012 A1 | 12/2006 | Ricard et al. |
| 2007/0016389 A1 | 1/2007 | Ozgen |
| 2009/0070085 A1 | 3/2009 | Gullapalli et al. |
| 2010/0030534 A1 | 2/2010 | Reich et al. |
| 2010/0128932 A1 | 5/2010 | Dvorkin et al. |
| 2010/0156901 A1 | 6/2010 | Park et al. |
| 2010/0312535 A1 | 12/2010 | Chen et al. |
| 2011/0184711 A1 | 7/2011 | Altman et al. |
| 2011/0313744 A1 | 12/2011 | Oury et al. |
| 2012/0179436 A1 | 7/2012 | Fung |
| 2012/0310614 A1 | 12/2012 | Beattie et al. |
| 2013/0018641 A1* | 1/2013 | Prisco ............... G06F 30/20 703/9 |
| 2013/0116997 A1 | 5/2013 | Sun et al. |
| 2013/0317791 A1 | 11/2013 | Danielson |
| 2014/0019053 A1 | 1/2014 | De Prisco |
| 2014/0067347 A1* | 3/2014 | Gurpinar ............... E21B 43/16 703/2 |
| 2014/0343858 A1 | 11/2014 | Crouse et al. |
| 2015/0048007 A1* | 2/2015 | Weerasooriya ......... C10G 1/045 208/390 |
| 2015/0051892 A1 | 2/2015 | Carvajal et al. |
| 2015/0059447 A1* | 3/2015 | Rickards ............... G01N 11/00 73/61.41 |
| 2015/0066463 A1 | 3/2015 | Shetty et al. |
| 2015/0141303 A1* | 5/2015 | Harwell ............... C09K 8/584 507/255 |
| 2015/0268080 A1* | 9/2015 | Crouse ............... E21B 49/00 702/45 |
| 2016/0188768 A1 | 6/2016 | Gopalakrishnan et al. |
| 2016/0209256 A1 | 7/2016 | Crouse et al. |
| 2017/0198573 A1 | 7/2017 | Kim et al. |
| 2018/0120213 A1 | 5/2018 | Dyshlyuk et al. |
| 2019/0050508 A1 | 2/2019 | Crouse et al. |
| 2019/0086250 A1 | 3/2019 | Crouse et al. |
| 2019/0212241 A1 | 7/2019 | Crouse et al. |
| 2019/0368344 A1 | 12/2019 | Crouse et al. |
| 2020/0063532 A1* | 2/2020 | Crouse ............... E21B 43/166 |

FOREIGN PATENT DOCUMENTS

| | | |
|---|---|---|
| WO | WO 1999034308 | 7/1999 |
| WO | WO 2008021652 | 2/2008 |
| WO | WO 2012071090 | 5/2012 |
| WO | WO 2016159807 | 10/2016 |
| WO | WO-2019097272 A1 * | 5/2019 ............. C09K 8/584 |

OTHER PUBLICATIONS

Catala, et al. "Fluid Flow Fundamentals." Oilfield Review, Dec. 31, 1996, 61-64.

Chatterjee et al., "A hybrid lattice Boltzmann model for solid-liquid phase transition in presence of fluid flow," Physics Letters A, Mar. 6, 2006, 351(4-5):359-367.

Chen & Ohashi, "The foundation and its application of the lattice Boltzmann method," Simulation, Nippon-Steel Technical Information Center, Ltd., Sep. 15, 1998, 17(3): 43-49 (with abstract).

Chen et al., "Lattice Boltzmann method for fluid flows," Annual review of fluid mechanics, Jan. 1998, 30(1):329-64.

CN Office Action in Chinese Appln. No. 201480049496.X; dated Dec. 18, 2017; 18 pages (with English translation).

CN Office Action in Chinese Appln. No. 201580021949.2, dated Aug. 10, 2018, 103 pages (with English translation).

Dyn et al., "Optimizing 3D Triangulations Using Discrete Curvature Analysis," Mathematical Methods for Curves and Surfaces: Oslo Jan. 1, 2001, 1:135-146.

EP Extended European Search Report in EP Appln. No. 18744797.4, dated Dec. 5, 2019, 10 pages.

EP Office Action in European Appln. No. 15764161.4-1001, dated Apr. 15, 2019, 8 pages.

EP Office Action in European Appln. No. 19192927.2 dated Jan. 7, 2020, 9 pages.

EP Supplemental European Search Report and Written Opinion, in European Appln. No. 14797363, dated Apr. 18, 2017, 11 pages.

EP Supplemental European Search Report in Appln. No. 15764161, dated Nov. 10, 2017, 9 pages.

EP Supplemental European Search Report in European Appln. No. 14832274.6, dated Apr. 3, 2017, 7 pages.

EP Supplemental European Search Report in European Appln. No. 18744797.4, dated Dec. 5, 2019, 39 pages.

EPO Extended European Search Report in European Appln. No. 19192927.2, dated Jan. 7, 2020, 9 pages.

Hamedi et al., "Pore-scale investigation of phase distribution and residual-oil development during secondary and tertiary solvent injection," SPE Reservoir Evaluation & Engineering. Feb. 1, 2015, 18(01):39-52.

Han et al., "Modelling of thermal contact resistance within the framework of the thermal lattice Boltzmann method," International Journal of Thermal Sciences, Oct. 1, 2008, 47(10):1276-1283.

Healy et al., "Status of Miscible Flooding Technology," 14th World Petroleum Congress, Jan. 1, 1994, 407-409.

Hoshen & Kopelman, "Percolation and cluster distribution. I. Cluster multiple labeling technique and critical concentration algorithm," Physical Review B, Oct. 15, 1976, 14:8:3438-3445.

Huang et al.; "Shan-and-Chen Type Multiphase Lattice Boltzmann Study of Viscous Coupling Effects for Two-Phase Flow in Porour Media," International Journal for Numerical Methods in Fluids, Sep. 30, 2009; 61(3):341-354.

JP Office Action in Japanese Appln. No. 2016-507600, dated Jul. 10, 2018, 23 pages (with English translation).

Karsch, "Lattice simulations of the thermodynamics of strongly interacting elementary particles and the exploration of new phases of matter in relativistic heavy ion collisions," InJournal of Physics: Conference Series 2006 , 46(1):122-131.

Kovscek et al., "A Pore-Level Scenario for the Development of Mixed-Wettability in Oil Reservoirs," Earth Science Division of Lawrence Berkeley Laboratory and Department of Chemical Engineering, prepared for U.S. Department of Energy, Sep. 1992, 1-58.

Ladd et al., "Lattice-Boltzmann simulations of particle-fluid suspensions," Journal of statistical physics, Sep. 1, 2001, 104(5-6):1191-251.

(56) References Cited

OTHER PUBLICATIONS

Lee et al. "A stable discretization of the lattice Boltzmann equation for simulation of incompressible two-phase flows at high density ratio," Journal of Computational Physics, Jun. 10, 2005, 206(1):16-47.
Notification of Reasons for Rejection with English Translation; JP Appln. No. 2016-514084; dated Jun. 21, 2018, 6 pages.
PCT International Search Report and Written Opinion in International Appln. No. PCT/US2019/013079, dated Apr. 1, 2019, 11 pages.
PCT International Search Report and Written Opinion, in International Appln. No. PCT/US2014/038143, dated Sep. 10, 2014, 9 pages.
PCT International Search Report and Written Opinion, in International Appln. No. PCT/US2015/021075, dated Jul. 8, 2015, 9 pages.
PCT International Search Report and Written Opinion, in International Appln. No. PCT/US2018/015408, dated Mar. 12, 2018, 6 pages.
Pepiot et al., "Numerical analysis of the dynamics of two- and three-dimensional fluidized bed reactors using an Euler-Lagrange approach," Powder Technology, Apr. 1, 2012, 220: 104-121.
Petkov et al., "Efficient LBM visual simulation on face-centered cubic lattices," IEEE Transactions on Visualization and Computer Graphics, Feb. 27, 2009, 15(5):802-14.
petrowiki.org/Miscible_flooding [online] "Miscible flooding" Aug. 19, 2013, retrieved on Oct. 10, 2019, retrieved from URL <https://petrowiki.org/Miscible_flooding>, 9 pages.
Prodanovic et al., "Investigating matrix/fracture transfer via a level set method for drainage and imbibition," Spe Journal, Mar. 1, 2010, 15(01):125-36.
Raabe, "Overview of the lattice Boltzmann method for nano- and microscale fluid dynamics in materials science and engineering," Modelling and Simulation in Materials Science and Engineering, Sep. 16, 2004, 12(6):R13-R46.
Ramstad et al., "Simulation of two-phase flow in reservoir rocks using a lattice Boltzmann method," Spe Journal, Dec. 1, 2010, 15(04):917-27.
Sohrabi et al., "Novel Insights into the Pore-scale Mechanisms of Enhanced Oil Recovery by CO2 Injection," 74th EAGE Conference and Exhibition, Jun. 4, 2012, 154529:1-14.
Sohrabi et al., "Visualisation of residual oil recovery by near-miscible gas and SWAG injection using high-pressure micromodels," Transport in Porous Media, Sep. 1, 2008, 74(2):239-57.
Tsuji et al., "Characterization of immiscible fluid displacement processes with various capillary numbers and viscosity ratios in 3D natural sandstone," Advances in Water Resources, Sep. 1, 2016, 95:3-15.
Van Den Pijl, "Computation of bubbly flows with a mass-conserving level-set method," Dissertation at Delft University of Technology, Nov. 22, 2005, 139 pages.
Xu et al., "Continuous vs Discontinuous Capillary Desaturation and Implications for IOR/EOR," InPaper SCA2018-066 presented at at the International Symposium of the Society of Core Analysts held in Trondheim, Norway, Aug. 2018, 1-10.
Yiotis et al., "Blob population dynamics during immiscible two-phase flows in reconstructed porous media," Physical Review E, Mar. 4, 2013, 87(3):1-12.
EP Extended European Search Report in EP Appln. No. 19738994.3, dated Feb. 2, 2021, 12 pages.
EP Extended European Search Report in EP Appln. No. 20194619.1, dated Jan. 28, 2021, 6 pages.
Man et al., "Pore Network Modelling of Electrical Resistivity and Capillary Pressure Characteristics", Transport in Porous Media, Dec. 2000, 41(3):263-285.
Mohammadmoradi et al., "Petrophysical Characterization of Porous Media Starting from Micro-Tomographic Images", Advances in Water Resources, May 2016, 35 pages.
Motealleh et al., "Unified Model of Drainage and Imbibition in 3D Fractionally Wet Porous Media" Transport in Porous Media, Jul. 2013, 99(3):581-611.
PCT International Preliminary Report on Patentability in International Appln. No. PCT/US2019/013079, dated Jul. 14, 2020, 10 pages.

\* cited by examiner

DETERMINATION OF HYDROCARBON MOBILIZATION POTENTIAL FOR ENHANCED OIL RECOVERY

BACKGROUND

This disclosure relates to multi-phase fluid flow simulation and, in particular, simulation or modeling of fluid displacement processes.

Two-phase relative permeability (e.g., relative permeability curves (kr)) describe how easily one fluid, e.g., oil, can be moved through a porous medium in the presence of another fluid, e.g., water. It is an important characteristic of hydrocarbon reservoir rocks and a crucial input to oil and gas reservoir modeling and simulation activities.

In the context of water displacement of oil in porous rock, water is injected through an injector well to displace oil and push oil towards a producer well. During displacement some oil may become trapped in pore spaces of the porous rock. Such oil is considered immobile and cannot be displaced by typical displacement processes. Immobile oil that is trapped in the pore space of porous rock cannot be displaced unless enhanced oil recovery (EOR) methods are applied. EOR methods attempt to mobilize trapped oil and thus increase oil recovery.

The term "wettability" is used as a measure of a fluid's tendency to stick to (or wet) surfaces compared to a second fluid in the same pore space, that is, the tendency of one fluid to spread on or adhere to a solid surface in the presence of other immiscible fluids. In the petroleum context, wettability is the tendency of a reservoir rock surface to preferentially contact a particular fluid in a multiphase or two-phase fluid system.

Relative permeability and multi-phase flow through porous media, in general, is dependent on various characteristics of the fluid-fluid-rock system, including rock surface properties, physical properties of each fluid, and flow conditions. One flow characteristic is the non-dimensional "Capillary number" (Ca) that represents the ratio of viscous forces to capillary forces. "Capillary number" (Ca) is usually defined as the superficial fluid velocity times the viscosity of a reference fluid divided by the fluid-fluid interfacial tension. Another characteristic is "wettability", which represents a preference of a rock surface for one fluid over another one, and is manifested as a measurable property known as contact angle. Wettability is often classified as water-wet (average contact angle 0-90 degrees), neutral-wet (~90 degrees), oil-wet (90-180 degrees), or some variation thereof such as strongly water-wet or weakly oil-wet.

Wettability has a strong influence on multi-phase flow behavior in porous material, such as oil and water, oil and gas, or water and gas flowing through reservoir rock. Reservoir rocks (unlike man-made materials) tend to have spatially varying wettability, i.e., the contact angle varies from location to location on the surfaces within the pore space of a rock. The contact angle distribution is a result of the mineral composition and the geological history of a hydrocarbon-bearing rock as well as surface texture, chemical composition of fluids (e.g., water, oil) in contact with the rock, etc. Prior to contact with oil, rocks are almost always naturally water-wet; as oil invades the pore-space over geologic time, the initial water-wet character may be altered in certain locations due to adhesion of substances within the oil phase. Mechanisms of wettability alteration depend on various local system properties such as pressure, temperature, mineral type, and fluid composition.

SUMMARY

The disclosed subject matter provides effective techniques to predict effectiveness of various EOR methods by analyzing immobile oil (trapped oil) and provide guidance for planning an EOR study. A computing system executes a multiphase flow simulation to obtain predictions of flow behavior of oil in the presence of a waterflood of a porous reservoir rock. Subsequent to the execution of the multiphase flow simulation, immobile oil blobs or patches in the porous reservoir rock are located and identified. These oil blobs in the sample pore space are analyzed with respect to size, shape, surrounding pore space characteristics, such as boundary surfaces and connected pore space regions. The oil blobs in the sample pore space are also analyzed with respect to local and global flow conditions (e.g., pressure and velocity field), and wettability of the rock in vicinities of the blobs. Each analyzed blob is assessed over iterations of changing conditions to determine conditions that will mobilize that oil blob. An integration over all oil blobs will lead to an assessment of efficiency of a certain EOR method.

In one aspect, a computer-implemented method for estimating amounts of hydrocarbon recoverable from porous reservoir rock by at least one enhanced oil recovery (EOR) technique includes retrieving, by a computing system, a representation of a physical porous reservoir rock sample (porous reservoir rock), the representation including pore space and grain space data corresponding to the porous reservoir rock, subsequent to an execution of a multiphase flow simulation to obtain predictions of flow behavior of oil in the presence of a waterflood of the porous reservoir rock, locating substantially immobile oil blobs or patches in the retrieved representation of the porous reservoir rock; and for N number of substantially immobile oil blobs or patches (blobs), evaluating changes in mobility of the blobs for two or more iterations of a given EOR technique, with a first one of the two or more iterations expending a first level of effort and a second one of the two or more iterations expending a second, higher level of effort, to estimate an amount of change in mobilization of the blob between the first and the second iterations for the given EOR technique.

Other aspects include computer program products tangibly stored on non-transitory computer readable media and computation systems such as computer systems, computer servers.

The following are some of the additional features within one or more of the above aspects.

Integrating of all iterations at different levels of effort including the first and second levels of effort for the given EOR technique, provide an approximation of an incremental amount of oil recoverable oil for the given EOR technique according to the levels of effort. The given EOR technique is a first EOR technique, and evaluating the blobs further includes evaluating mobility of the blobs for two or more iterations of a second, different EOR technique, with a first one of the two or more iterations for the second EOR technique, expending a first level of effort and a second one of the two or more iterations for the second, different EOR technique expending a second, higher level of effort, to estimate an amount of change in mobilization of the blob between the first and the second iterations for the second, different EOR technique.

The aspects may further include producing evaluations for each of the first and second EOR techniques. Evaluating the blobs further includes integrating of all iterations at different levels of effort including the first and second levels of effort for each of the first and the second EOR techniques, to provide an approximation of an incremental amount of recoverable oil for each of the first EOR technique and the second EOR technique according to the levels of effort. The blobs include connected oil phase regions and/or oil patches being oil attached to walls of the porous reservoir rock. Effort includes an increase in an amount of a parameter of the given EOR technique. Effort includes one or two or more of injection flow rate and type of injection surfactants. Effort includes an increase in an amount of a parameter of each of the first EOR technique and the second EOR technique applied to the porous reservoir rock. Effort includes modifications to values of one or two or more of injection flow rate and type of injection surfactants.

One or more of the above aspects may provide one or more of the following advantages.

The above aspects provide estimates of the efficiencies of various potential EOR methods that can be applied to a reservoir without running an actual simulation for each potential EOR method. The efficiency estimates can be compared and provide guidance for deployment of a particular one of the EOR methods, and thus reduce the extent of testing that is needed to explore the EOR design space. The aspects can increase the value of relative permeability or capillary pressure simulations in multi-phase flow simulations, and provide insight into statistical distribution of mobilization efficiencies. The aspects may be useful in optimization of kr simulation configuration setups and in interpretation of results. For example, one result can be a prediction of whether displacement of one fluid by another fluid occurred above or below the critical Capillary number (where Capillary number is the ratio of viscous forces over capillary forces and critical Capillary number is a value of the Capillary number, which defines the onset of oil mobilization leading to oil recovery.) These aspects may also be applied on fluid distributions in a pore space that is obtained from 3D images taken from physical rock samples in laboratory fluid displacement experiments.

Other features and advantages of the invention will become apparent from the following description, and from the claims.

DETAILED DESCRIPTION

Enhanced Oil Recovery (EOR), often referred to as tertiary recovery, encompasses various techniques to extract oil from a reservoir, which oil was not extracted during primary or secondary oil recovery. At a microscopic level, non-extracted oil is often associated with trapped or immobile oil. All EOR methods try to minimize trapped or immobile oil. Two types of displacement efficiency are considered microscopic displacement efficiency and macroscopic displacement efficiency.

Microscopic displacement efficiency can be described in the form of relative permeability functions. Two-phase relative permeability (kr) describes how easily one fluid can be moved through a porous medium in the presence of another fluid. Relative permeability curves also include the amount of trapped oil, often called residual oil. Relative permeability curves are a characteristic of hydrocarbon reservoir rocks and an input to oil and gas reservoir modeling and simulation activities. Relative permeability and multi-phase flow through porous media, in general, is dependent on various characteristics of the fluid-fluid-rock system, including rock surface properties, physical properties of each fluid, and flow conditions.

One flow condition is the non-dimensional Capillary number (Ca) that represents the ratio of viscous forces over capillary forces, and is usually defined as the average fluid velocity times the viscosity of a reference fluid divided by the fluid-fluid interfacial tension. Another property is "wettability," i.e., the preference of a rock surface for one fluid over another one. Wettability is manifested as a measurable property known as contact angle. Wettability is often classified as water-wet (average contact angle 0 up to about 90 degrees), neutral-wet (about 90 degrees), oil-wet (slightly above 90 degrees to 180 degrees) or some variation thereof such as strongly water-wet or weakly oil-wet.

The mobilization of an oil blob will lead to at least partial recovery of the oil blob. Mobilization enhances oil recovery. The integration of all oil blob mobilizations for one effort level for one EOR technique will correspond to a certain amount of incremental oil recovery. Then, for a specific EOR technique (e.g., a surfactant injection), the process evaluates more than one effort (e.g. successive increases in surfactant concentrations) and determines amounts increases in mobilization for all oil blobs in a reservoir rock. Recovery can be determined by integrating results across all oil blobs for each effort levels (e.g., increase in surfactant concentrations), so multiple effort levels will provide multiple integrated results that can be used and plotted or others rendered for an assessment.

Figure 1:
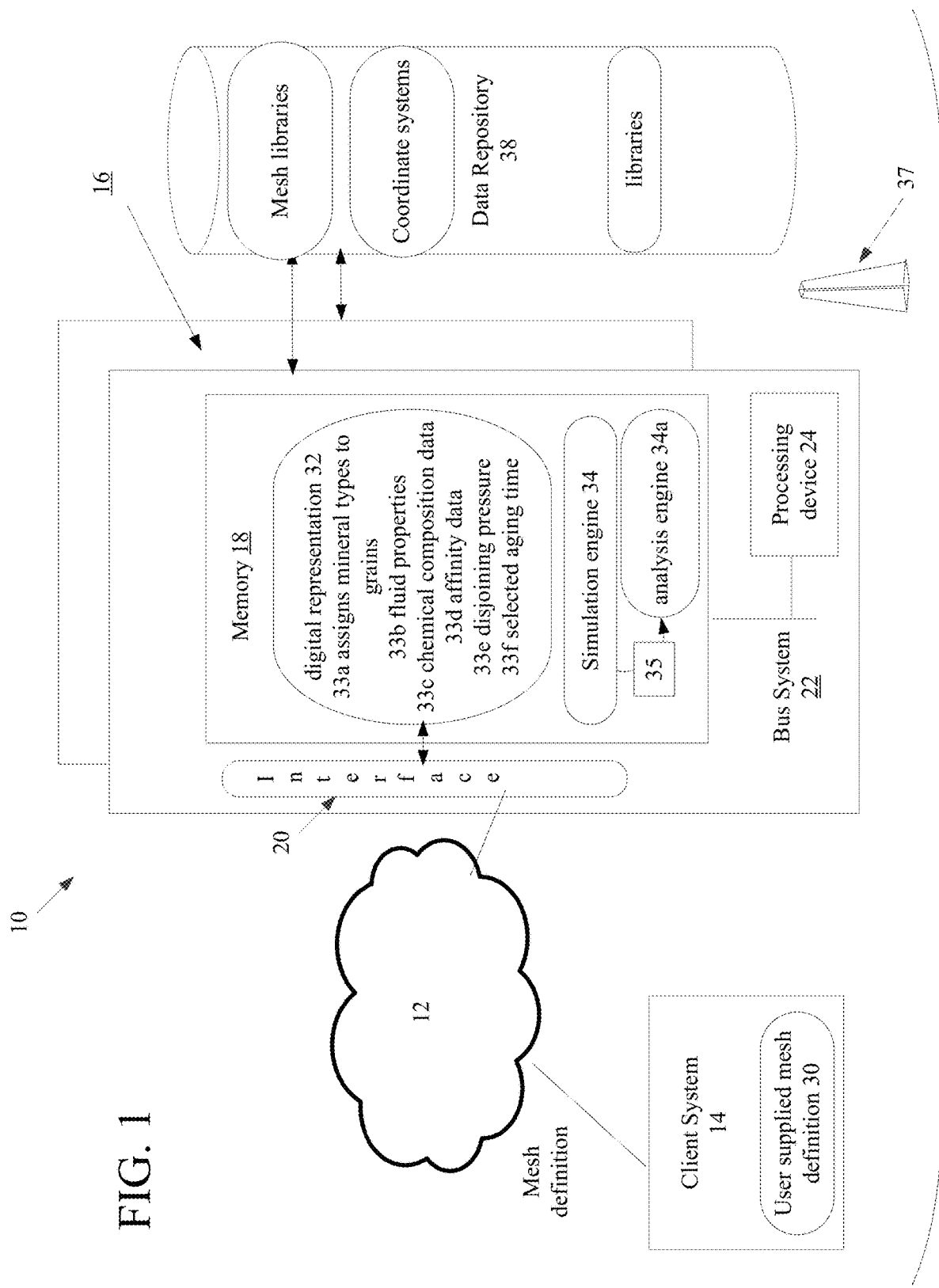
FIG. 1 is a block diagram of a system for predicting relative effectiveness of different enhanced oil recovery techniques.

Referring to FIG. 1, a system 10 for determining relative amounts of hydrocarbon recoverable from porous reservoir rock by one or two or more enhanced oil recovery techniques is shown. The system 10 in this implementation is based on a client-server or cloud-based architecture and includes a server system 12 implemented as a massively parallel computing system 12 (stand-alone or cloud-based) and a client system 14. The server system 12 includes memory 18, a bus system 22, interfaces 20 (e.g., user interfaces/network interfaces/display or monitor interfaces, etc.) and a processing device 24.

In memory 18 is a 3D imaging engine 32 that generates a digital representation, e.g., of a porous reservoir rock formation and an image analysis engine 32b that determines characteristics of the geometry of a pore space network in the porous reservoir rock formation from analysis of the digital representation of the porous reservoir rock formation.

Also in memory 18 is a simulation engine 34 that executes a numerical multiphase flow simulation for various saturation values to obtain predictions of flow behavior including relative permeability as a function of saturation through the digital representation of the porous reservoir rock formation. In some embodiments, simulating multi-phase flow behavior occurs through a reservoir rock adjacent a gas or oil well (e.g., drilling rig 37).

The digital representation of the porous reservoir rock formation and the image analysis conducted by engine 32, which is used to determine the characteristics of the pore space network, can be third party applications that are executed on a different system than server 12. The system 10 merely requires the digital representation of the formation and the analysis of the pore space network available as input to the simulation engine 34. One approach to provide the digital representation of the reservoir rock sample is to obtain the representation, for example, from a 3D imaging of the porous reservoir rock formation that is generated from a micro CT scan of reservoir rock sample(s).

The memory 18 also stores parameters used by the engine 34, such as grain surface properties obtained by assigning mineral types 33a to the grains to determine the surface properties for each of those mineral types, and surface texture and roughness properties. The memory 18 also stores parameters such as fluid properties 33b, e.g., fluid density and viscosity of each expected fluid, (e.g., two or more of water, gas, oil) and fluid-fluid interfacial tension properties. The memory 18 also stores parameters such as chemical composition data 33c of the fluids and affinity data 33d of the fluid components for the particular mineral types. The memory 18 also stores disjoining pressure 33e for each mineral type in combination with the fluids, and a selected 33f aging time used by the aging engine 32. In addition, reservoir pressure and temperature data are also stored. The mineral types evaluated can be those found or expected at the actual site of the reservoir.

The simulation engine 34 includes a module (not shown) to set up the reservoir rock sample simulation environment and a module (not shown) to perform pore-scale numerical simulation of a waterflood. The system also includes an analysis module 34a that enables investigating relative effectiveness of different levels of effort for each of one or two or more EOR methods, by analyzing immobile oil (trapped oil), subsequent to the simulated waterflood of the porous reservoir rock to provide guidance for planning an EOR study.

In general the simulation need be run only once for a given reservoir rock sample and upon completion of the simulation, an analysis engine 34a is used to determine relative effectiveness effort level(s) for each of one or two or more EOR methods. It is most likely that for most implementations computation costs (processor, memory resources, etc. and time, etc.) will be lower for execution of the analysis engine 34a than the simulation engine 34.

The analysis engine (module) 34a analyzes each oil blob in the pore space, with respect to the oil blob's size, shape, surrounding geometry of the pore space (boundary and connected pore space regions), as well as local and global flow conditions (pressure and velocity field), and wettability in the vicinity of the blob over one or two or more iterations of changing parameters used for a given EOR technique. In some implementations one iteration per EOR technique may be used, whereas in other implementations two iterations or more may be needed. In some implementations, the analysis would involve two or more elevated effort levels for one or more EOR methods, and in other implementations the analysis would involve one or more elevated effort levels for two or more EOR methods.

U.S. patent application entitled "Determination of Oil Removed by Gas via Miscible Displacement in Reservoir Rock" Ser. No. 16/545,387, filed Aug. 20, 2019, incorporated herein by reference, describes examples of a module to set up the reservoir rock sample simulation environment and a module to perform pore-scale numerical simulation of a waterflood.

Upon obtaining data from these analyses, each blob that remains subsequent to the simulation of the waterflood of the porous reservoir rock is located. The remaining blobs are substantially immobile (e.g., slow moving or trapped) oil blobs or patches. For N number of these substantially immobile oil blobs or patches (blobs), the module 34a evaluates the blobs over various levels of effort for each of one or two or more EOR techniques to estimate an amount of mobilization of the blob per level of effort, for the each of the one or two or more EOR techniques. In other words, a change in mobility for each blob is analyzed to determine an optimal level of effort needed for each EOR technique to mobilize that oil blob. The module 34a performs an integration of the amount mobilization over all oil blobs for each of plural applied efforts for each of the EOR techniques to provide measures of predicted efficiencies of the various EOR techniques.

Figure 2:
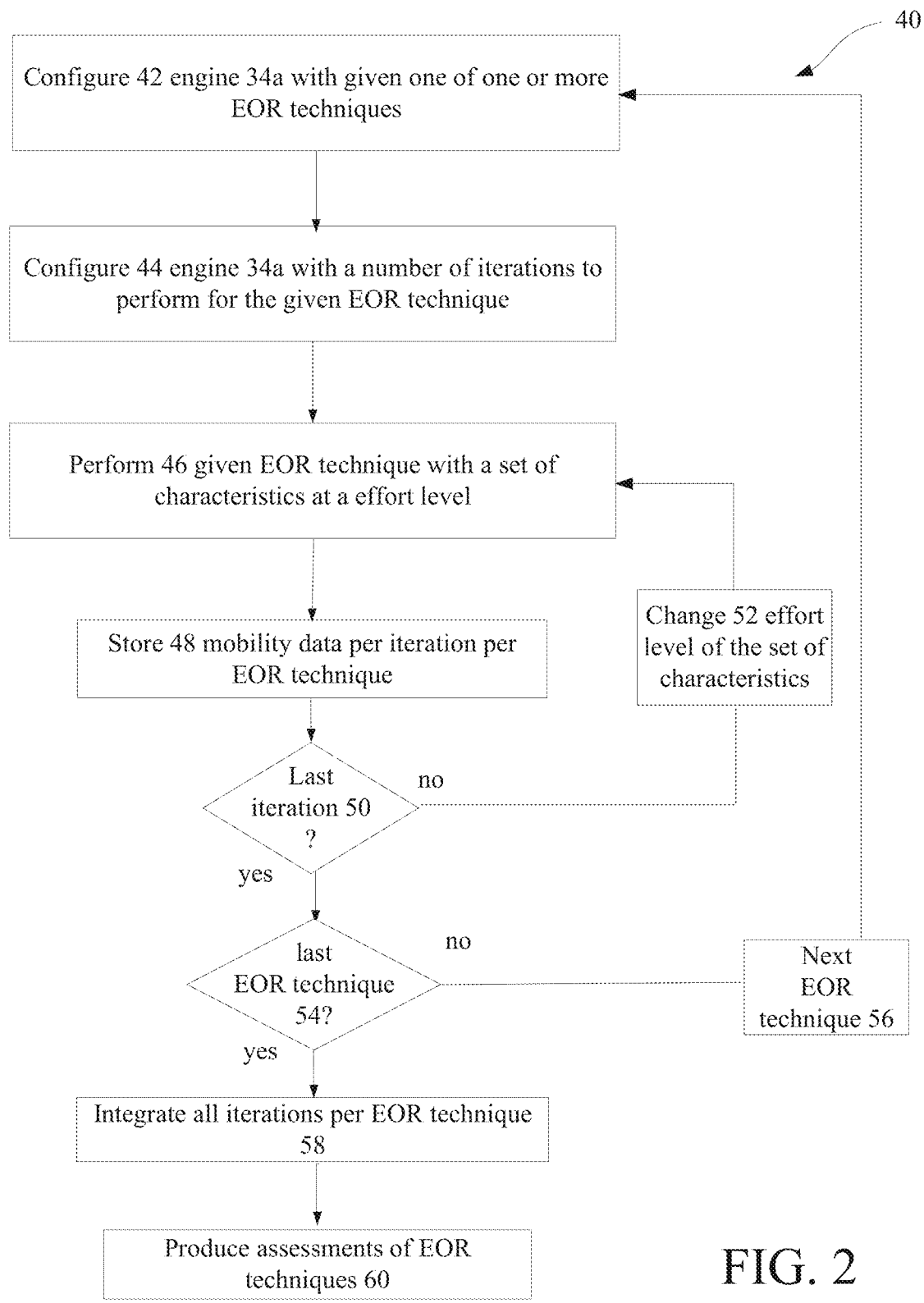
FIG. 2 depicts a flow chart showing operations for predicting relative effectiveness of different enhanced oil recovery techniques.

Referring now to FIG. 2, the module 34a performs EOR screening 40. The module 34a is configured 42 to perform a single simulation of a waterflood, and documents each trapped oil blob with respect to size, geometric extents, surrounding grain space with wetting conditions, local flow filed (pressure, velocity) and global flow field (pressure velocity). The analysis module 34a is configured 44 to perform several iterations of analysis for various levels of effort for each of the one or two or more different EOR techniques.

That is, the simulation engine 34 provides a state of the pore space after a waterflood. This state of the pore space is a representation 35 that is used by the analysis engine (module) 34a to conduct the analysis of effort level(s) and EOR technique(s) in order to determine an optimal amount of effort level(s) for a given EOR technique(s). This representation 35 that can be in the form of a data structure that stores in a structured manner data that describes the state of the pore space after the simulation (including characteristics of trapped oil blobs). In other implementation flat files or graphs or other computer constructs could be used. The representation 35 is fed to and used by the analysis module 34a to analyze 46 results of the simulation. The representation 35 is operated on by the analysis engine 34a to determine subsequent characteristics of the trapped oil blobs, as determined from the analysis engine 34a over various iterations of effort levels by applying a set of characteristics to the blobs, which set of characteristics represents a given effort level. Each iteration of effort produces data representative of the effectiveness of the iteration by determining relative increases blob mobility. The produced data is stored 48 per effort iteration and per EOR technique. The module 34a is configured to determine 50 if it is the last effort iteration for the given EOR technique. If it is not the last effort iteration 50, the module 34a is configured to change 52 the effort level of the set of characteristics, and perform 46 another effort iteration using the given EOR technique with the new, i.e., changed set of characteristics, which represent a new effort level.

The set of characteristics for a given EOR technique would be governed by the particular technique. For example, a characteristic can include flow rate, relative concentrations and types of surfactants, polymers and surfactant-polymer combinations, water alternating gas (WAG) cycles and duty cycle(s), etc. Other examples involve injecting other types of chemicals resolved in brine or water, injecting steam, injecting gas etc. Other characteristics include driving force (pressure head, body force, injected flow rate) versus miscible displacement (CO2 injection) versus wettability change versus change of mobility ratio, etc. The set of characteristics would depend on the type of EOR technique being simulated. An effort iteration, therefore, modifies one or two or more of the characteristics of the given EOR technique to analyze how that modification affects changes in blob mobility.

If it is the last of the configured iterations 50, the module 34a is configured to determine 54 if the engine 34a has simulated the last EOR technique. If it is not the last EOR technique, the analysis module 34a is configured to change 56 the technique and provide a new EOR technique. The analysis module 34a is configured with the new EOR technique, performs another analysis on the documented characteristics of each trapped oil blob with respect to size, geometric extents, surrounding grain space with wetting conditions, local flow filed (pressure, velocity) and global flow field (pressure velocity) according to the new EOR technique. The analysis module 34a analyzes 46 results of the simulation (documented characteristics) over various iterations of effort levels, for a given number of effort iterations with different effort levels (sets of characteristics for the given EOR technique). If it is the last EOR technique, the module 34a is configured to evaluate 58 results from all iterations per EOR technique, and produce 60 assessments for the various EOR techniques simulated.

Figure 3:
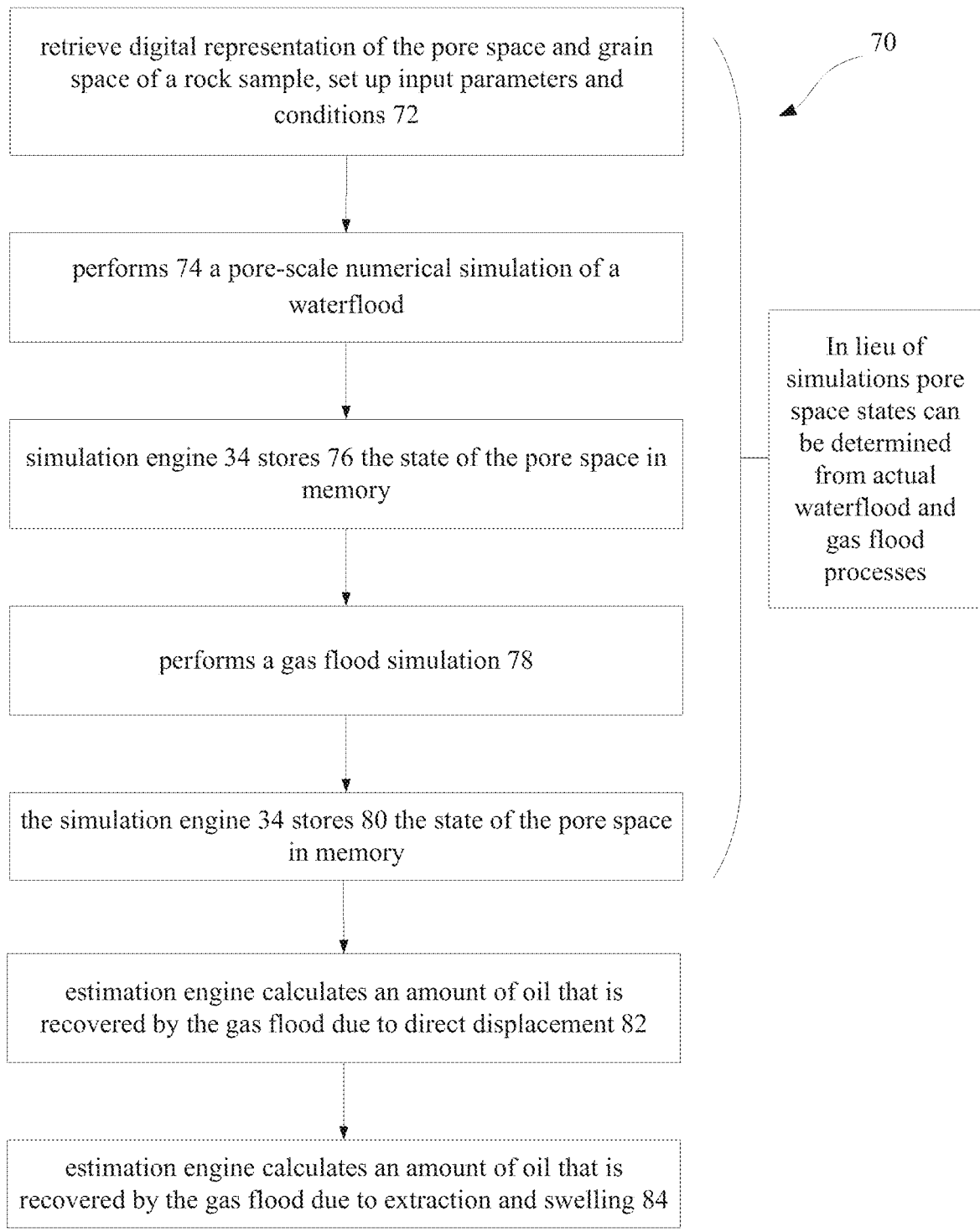
FIG. 3 depicts a flow chart showing gas flood simulation operations for estimating oil recovery.

Referring now to FIG. 3, the module 34a, starting from the waterflood, performs a first EOR simulation 70. For example, the module 34a performs a gas flood and calculates how much oil is produced by the gas flood, and how much of that produced oil is due to direct displacement versus extraction and swelling. The system 10 accesses a data repository 38 that stores 2D and/or 3D meshes, coordinate systems, and libraries that can be used in the simulations using any well-known computational technique such as computational fluid dynamics or the so-called Lattice Boltzmann method.

In other examples, rather than a gas flood being used to represent the state of the pore space of reservoir rock a surfactant or polymer flood is used. The reason is that gas injection is a third phase (oil, water, gas) an while generally acceptable it is also possible to use surfactant or polymer flood. A surfactant flood or polymer flood is not considered a new phase. Instead, water or brine is modified using surfactants or polymers in fundamental physical properties (viscosity, interfacial tension) to improve recovery.

Upon receiving or retrieving 72 a digital representation of the pore space and grain space of a reservoir rock sample, the simulation engine module 34b sets up input parameters and conditions to perform a pore-scale numerical simulation of the waterflood and using the set up simulation environment, performs 74 the pore-scale numerical simulation of the waterflood. Upon performing the waterflood 74, the simulation engine 34 stores 76 the state of the pore space in memory and performs a gas flood simulation 78. Upon performing the gas flood 78, the simulation engine 34 also stores 80 the state of the pore space in memory after performance of the gas flood simulation 78. Using results of the simulation of the gas flood, an estimation engine that can be part of the simulation engine calculates 46a an amount of oil that is recovered by the gas flood due to direct displacement and calculates 46b the amount that is recovered due to extraction and swelling.

The system 10 is described as using the LBM technique for conducting the waterflood and gas flood, etc. simulations; however, as mentioned above, any of the various well-known computational techniques in computational fluid dynamics can be used.

For explanatory purposes, a brief description of multi-phase simulations is provided using the "Lattice Boltzmann Method" (LBM) for fluid flow simulation. Unlike other Computation Fluid Dynamic techniques that numerically solve conservation equations of macroscopic properties (i.e., mass, momentum, and energy), the LBM technique models fluids as "particles", and such particles perform consecutive propagation and collision processes over a lattice mesh made up of voxels. Voxels can be of different sizes and serve as basic unit area of fluid flow analysis. Voxels are associated with characteristics that describe the state of a fluid in a particular region (including, for example, velocity vectors that describe the velocity of the fluid in that region). During each time-step of a simulation, fluid may move from one voxel to another voxel according to the velocity vectors. Collision operators describe the effect of different fluids colliding due to the fluid movement.

The LBM technique can be implemented efficiently on scalable computer platforms and run with great robustness for time unsteady flows and complex boundary conditions. In one example, pore-scale multiphase fluid flow simulation results can be used to understand the fluid displacement mechanisms in reservoir rock. Micro-CT images of reservoir rock can be used to construct the geometry of the porosity that is used as input to each of the simulations.

The system 10 using the LBM technique determines relative permeability and multi-phase flow through the porous media, which, in general, are dependent on various characteristics of the fluid-fluid-rock system, including rock surface properties, physical properties of each fluid, and flow conditions. One flow condition is the non-dimensional Capillary number (Ca) that represents the ratio of viscous forces over capillary forces, and is usually defined as the average fluid velocity times the viscosity of a reference fluid divided by the fluid-fluid interfacial tension. Another property is the wettability which represents the preference of the rock surface for one fluid over another one, and manifests as a measurable property known as contact angle.

The system 10 when configured for conducting simulations of waterfloods and gas floods is first configured for conducting the waterflood simulation. For simulating a waterflood, the simulation is set up as a two fluid simulation, with water being the one fluid that is injected into the pore space and oil being the other fluid. Simulating a waterflood process is essentially simulating displacement resulting from injection of water. For a typical wettability process, the process is set up to be an iterative process where wettability alteration is performed followed by fluid phase redistribution. The process is repeated until the engine 34 determines that the wettability alteration converges (as measured by further repetitions not significantly changing the results (e.g., contact angles). The process 40 references an established threshold value that provides an amount by which a contact angle would need to vary to otherwise halt further iterations of wettability alternation simulations. One such process is disclosed in U.S. patent application Ser. No. 16/243,285, filed Jan. 9, 2019, entitled "DETERMINING FLUID FLOW CHARACTERISTICS OF POROUS MEDIUMS," the entire contents of which are incorporated herein by reference. The wettability process uses a two-phase relative permeability (kr) process to determine how easily one fluid, e.g., oil, can be moved through the presence of another fluid, e.g., water.

Two-phase relative permeability is an important characteristic of hydrocarbon reservoir rocks and a crucial input to oil and gas reservoir modeling and simulation activities. One technique to determine two-phase relative permeability is disclosed in U.S. patent application Ser. No. 14/277,909, filed May 15, 2014 entitled "MASS EXCHANGE MODEL FOR RELATIVE PERMEABILITY SIMULATION" published as US-2014-0343858-A1 on Nov. 20, 2014, the entire contents of which are incorporated herein by reference.

The system 10, when configured for conducting simulations of waterfloods and gas floods, may also track blobs in the formation. One technique to determine two-phase relative permeability is disclosed in U.S. patent application Ser. No. 14/660,019, filed Mar. 17, 2015 entitled "FLUID BLOB TRACKING FOR EVALUATION OF MULTIPHASE FLOW SIMULATIONS" published as US-2015-0268080-A1 on Sep. 24, 2015, the entire contents of which are incorporated herein by reference.

Upon performance of the waterflood simulation, a gas flood simulation (of a particular EOR type) is conducted. The simulation engine 34 is thus configured for conducting the gas flood simulation from the state of the pore space that results from the waterflood simulation, with residual water in the pore space being one of the fluids and hydrocarbon (miscible gas+oil) being the other fluid. The gas flood simulation is conducted using the techniques discussed above, except that the simulation is configured for the hydrocarbon (combined quantities of injected gas and oil) and the residual water.

While exemplary simulation techniques for the waterflood and gas flood simulations have been described above, it is understood that these are exemplary. Thus in some implementations of estimating a predicted amount of potential oil recovery due to EOR techniques, other simulation techniques could be used. In addition, in some embodiments, actual field data of the state of a pore space can be used in lieu of conducting simulations.

Described below are examples of analyses models that are conducted on results of simulations (documented characteristics of trapped oil blobs, as determined from the simulation engine 34) over various iterations of effort levels.

Figure 4:
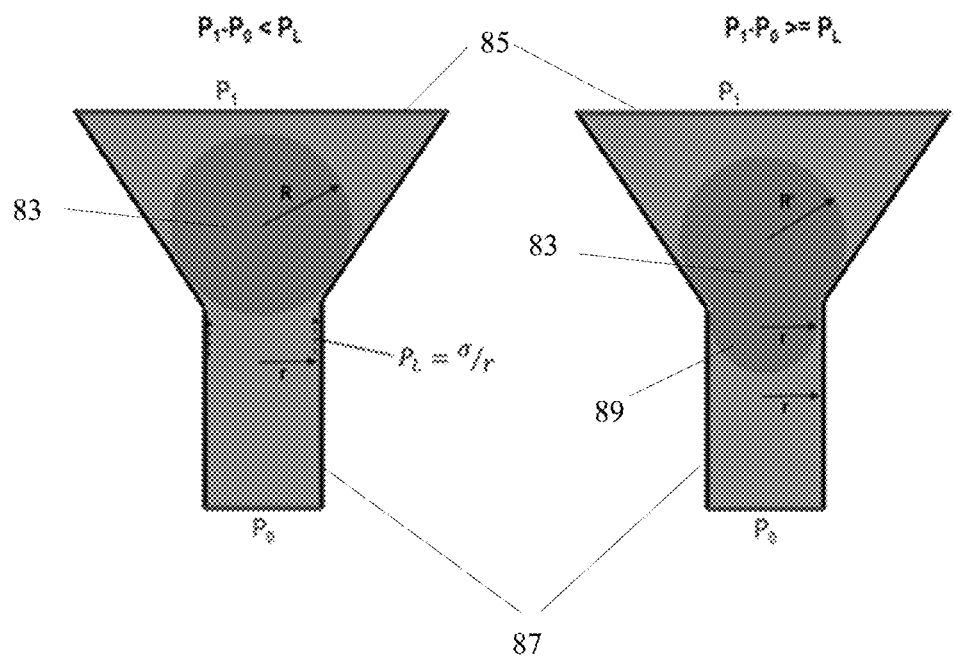
FIG. 4 depicts a 2D illustration of blob mobilization through a throat body.

Referring now to FIG. 4, a two dimensional (2D) model illustrating oil mobilization in a multi-fluid flow of water displacing oil, shows an oil droplet 83 (circle in center) trapped in front of a pore throat 85. The pressure $P_1$, on the top of the throat 84 is higher compared to the pressure $P_0$ on the bottom of the throat 87. The oil blob is pushed against the pore space boundary, so no water flow is possible, which means that viscous forces are not present.

A resisting force is defined by the radius of the throat and can be expressed using the Laplace law (see Equation 1 below). In order to push the oil blob through the throat, the applied pressure difference $P_1-P_0$ needs to be equal to or greater than $P_L$ or $P_1-P_0 \geq P_L$ where $P_L$ is the resisting capillary pressure given as $P_L=\sigma/r$. When $P_1-P_0 \geq P_L$, the curvature of the surface of the oil blob can achieve a curvature $1/r$ which is needed to have the oil blog 82 invade the pore throat 89. Therefore, so long as the trapping mechanism is known (in this case: the oil blob is blocking the throat), the needed force to mobilize the blob can be predicted/estimated.

Example 1 Throat-Body-Throat Tube Bundle

Figure 5:
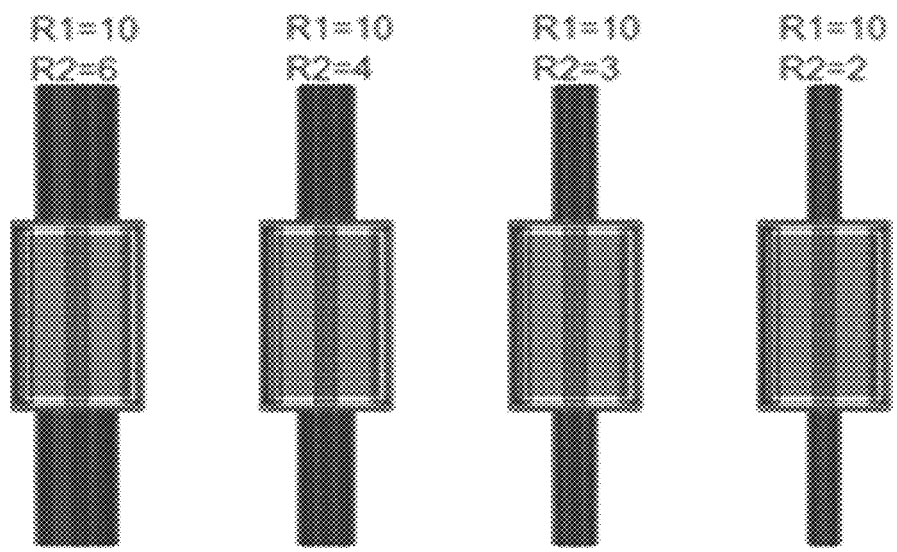
FIG. 5 depicts throat-body-throat tube bundle example.

Referring now to FIG. 5, an Example 1 is shown using a model that is a throat-body-throat tube bundle CDC (Capillary desaturation curve). In this first example, a tube bundle has or consisting of a series of simple pore throats—pore body tubes that are used to as a model for evaluating effort level(s) for EOR technique(s).

A Capillary Desaturation Curve approach is a method where the Capillary number is incrementally increased and the remaining oil saturation is measured and plotted as described above. In this case, each pore body (in vertical center in FIG. 5) is cylindrical in shape and has a radius of 10 voxels. The pore throats (not referenced) have a cylindrical shape and have various radii. The biggest radius on the left has a radius of 6 voxels and the smallest pore throat radius on the right is 2 voxels. A non-wetting fluid is initialized only in the pore body. This model is periodic in the z direction, connecting the top and the bottom of the fluid domain. A body force is used as the driving force. The reduction in pore radius going from body to throat (pore aspect ratio) leads to a trapping of the non-wetting fluid.

Figure 6:
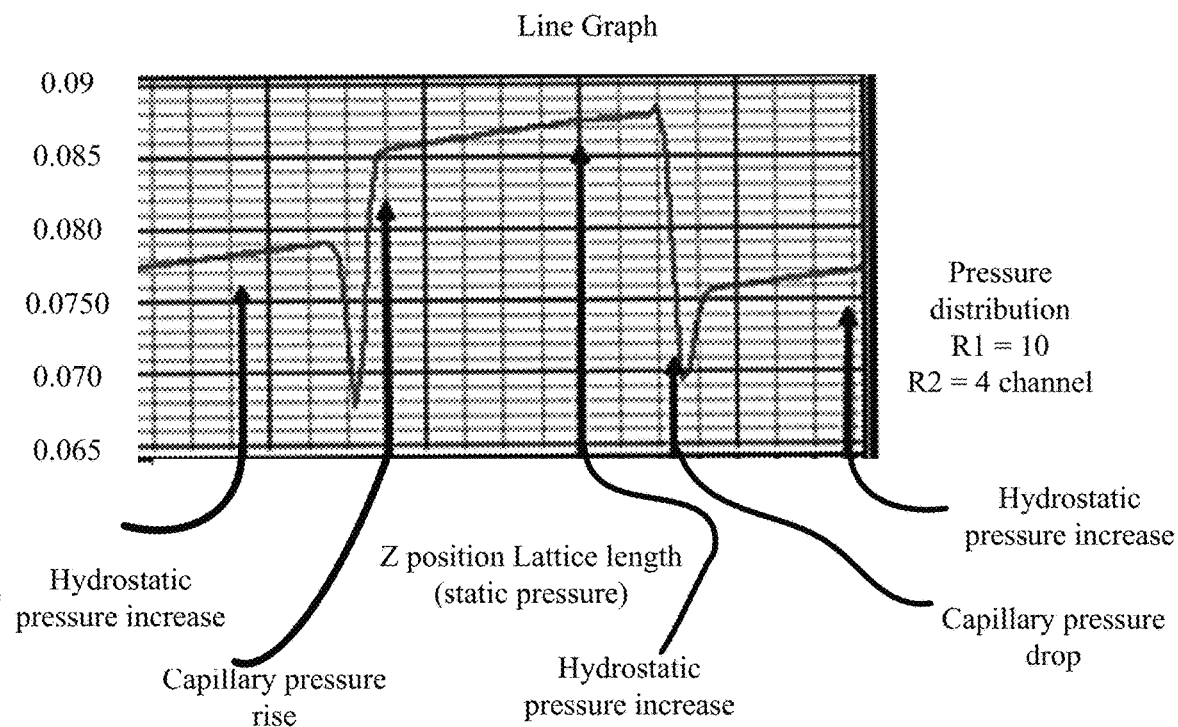
FIG. 6 depicts pressure distribution along the centerline of the pore throat/body

Referring now to FIG. 6 pressure distribution along the centerline of the pore throat/body of FIG. 5 is shown. FIG. 6 shows a plot of static pressure as a function of Z (position Lattice length). A mobilization of the trapped non-wetting fluid requires that the driving force (e.g., the body force) is at least as high as the resisting force, the Capillary pressure, which is related to the pore throat radius. The driving force is larger compared to the Capillary force caused by the geometric extends of the pore throat in flow direction as well as by the material properties of the pore space boundary (e.g. wettability).

The following equation describes this force balance where the left hand-side represents the driving force due to gravity, and the right hand-side represents the Capillary force described through the Laplace law:

$$\rho g (L_{top} + L_{middle} + L_{bottom}) = 2\sigma \left( \frac{1}{R_2} - \frac{1}{R_1} \right) \quad \text{(Equation 1)}$$

Figure 7:
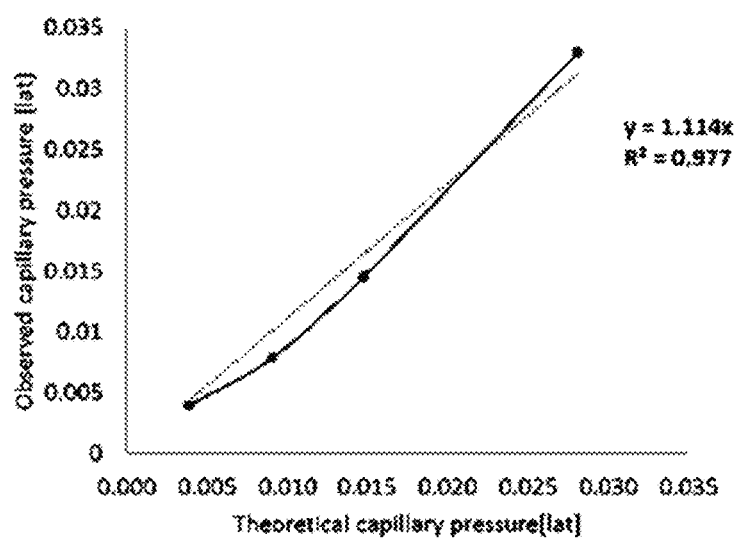
FIG. 7 is a plot of theoretical predicted mobilization pressure versus simulated mobilization pressure for the example of FIG. 5.

Referring now to FIG. 7, a theoretical predicted mobilization pressure versus simulated mobilization pressure is shown for the example of FIG. 4. As shown, the required driving force matches relatively well to a theoretical estimation using the Laplace law (Equation 1). In this case the needed driving force to mobilize was known by considering theoretical comparisons. This was possible because the topology of the geometry was exactly known and the geometry topology was simple, e.g., the radii of the pore throat and pore body (R1 and R2) as well as the length of the pore throat ($L_{top}$ and $L_{bottom}$) and the length of the pore body ($L_{middle}$).

Another way of determining the onset of mobilization is to measure the pressure on top of the non-wetting fluid ($P_{top}$) and the pressure right below the non-wetting fluid ($P_{bottom}$). The force balance that defines the onset of mobilization is given as:

$$P_{top} - P_{bottom} + \rho g L_{middle} = 2\sigma\left(\frac{1}{R_1} - \frac{1}{R_2}\right) \quad \text{(Equation 2)}$$

In a complex pore space like the pore space of porous rock, the topology of the geometry, combined with the fluid distribution is not simple, and the theoretical estimation method is likely not as reliable.

However, the approach described herein investigates the force balance by measuring all force contributors in the vicinity of trapped fluid entities (blobs) and calculates an estimate of an increase in the driving force that is needed to mobilize that trapped fluid entity. In this case, that would mean to measure $P_{top}$, $P_{bottom}$, $L_{middle}$, as well as $R_1$ and $R_2$. All of those quantities can be measured in pore space, and a driving force (e.g. body force) which is needed to mobilize that trapped fluid entity could be estimated.

Example 2: Berea Sandstone CDC

In the pore space of physical rock, the pore space and fluid flows are more complicated compared to Example 1, above. For water-wet rocks where oil is the non-wetting fluid, the force balance as described in Example 1 is still valid and can be applied. In order to explain the basic concept, a few simplifications are introduced. In pore spaces of real rocks, the trapped oil-blobs often do not block the flow of the wetting fluid, which leads to a simplification of Equation (2) because $P_{top}$, $P_{bottom}$ are nearly identical. To further simplify this example, it can be assumed that the radius of the pore body $R_1$ is much larger than the throat radius $R_2$. These simplifications are presented in order to provide a simple explanation of the potential of the disclosed subject matter, but are not particularly needed to practice the subject matter described herein.

The resulting simplified equation is as follows:

$$\rho g L_{middle} = 2\sigma\left(\frac{1}{R_2}\right) \quad \text{(Equation 3)}$$

The left-hand side of Equation 3 represents the driving force acting on a trapped blob of a certain length $L_{middle}$, the right-hand side represents the capillary pressure caused by the throat radius $R_2$ of the next throat where that blob was trapped. In order to demonstrate the potential for pore scale EOR screening, a relatively small domain (B200) is chosen as a test case.

Figure 8:
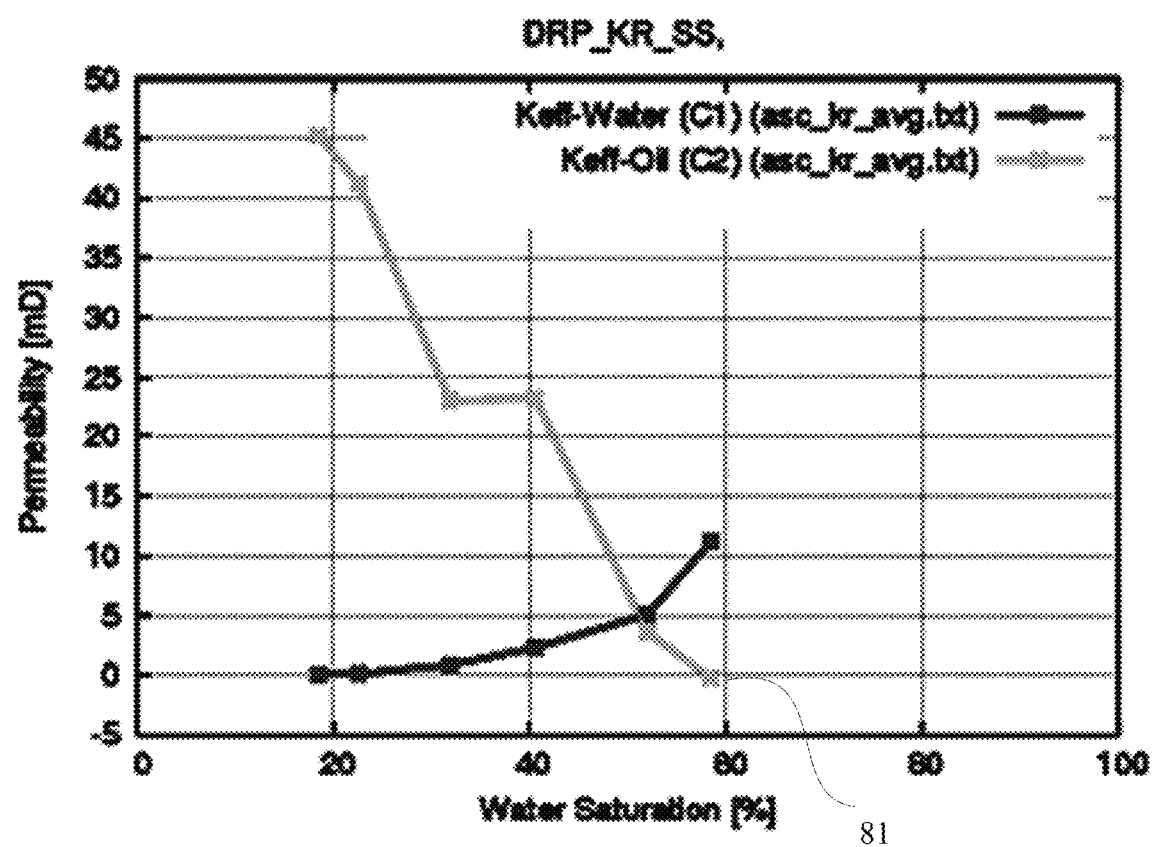
FIG. 8 is a plot of Berea Sandstone B200 relative permeability (kr) curve.

FIG. 8 shows permeability vs. water saturation and depicts the relative permeability kr curve as simulated for a Capillary number of 1.0E-5 for Berea Sandstone B200, used as a test case. The residual oil saturation is 42%. [This is depicted in FIG. 8 by (100%–the value (58%) of water saturation at point 81). The bottleneck radius (e. g., critical throat radius) for this pore space is 2.2 voxels. To further simplify, the demonstration assume that all pore throats have a radius of 2.2 voxels, e.g., a homogeneous pore space. Other implementations can include all relevant details to obtain the numerically exact pore throat radii in flow directions for each trapped blob by measuring the throat size at which each blob is trapped.

Figure 9:
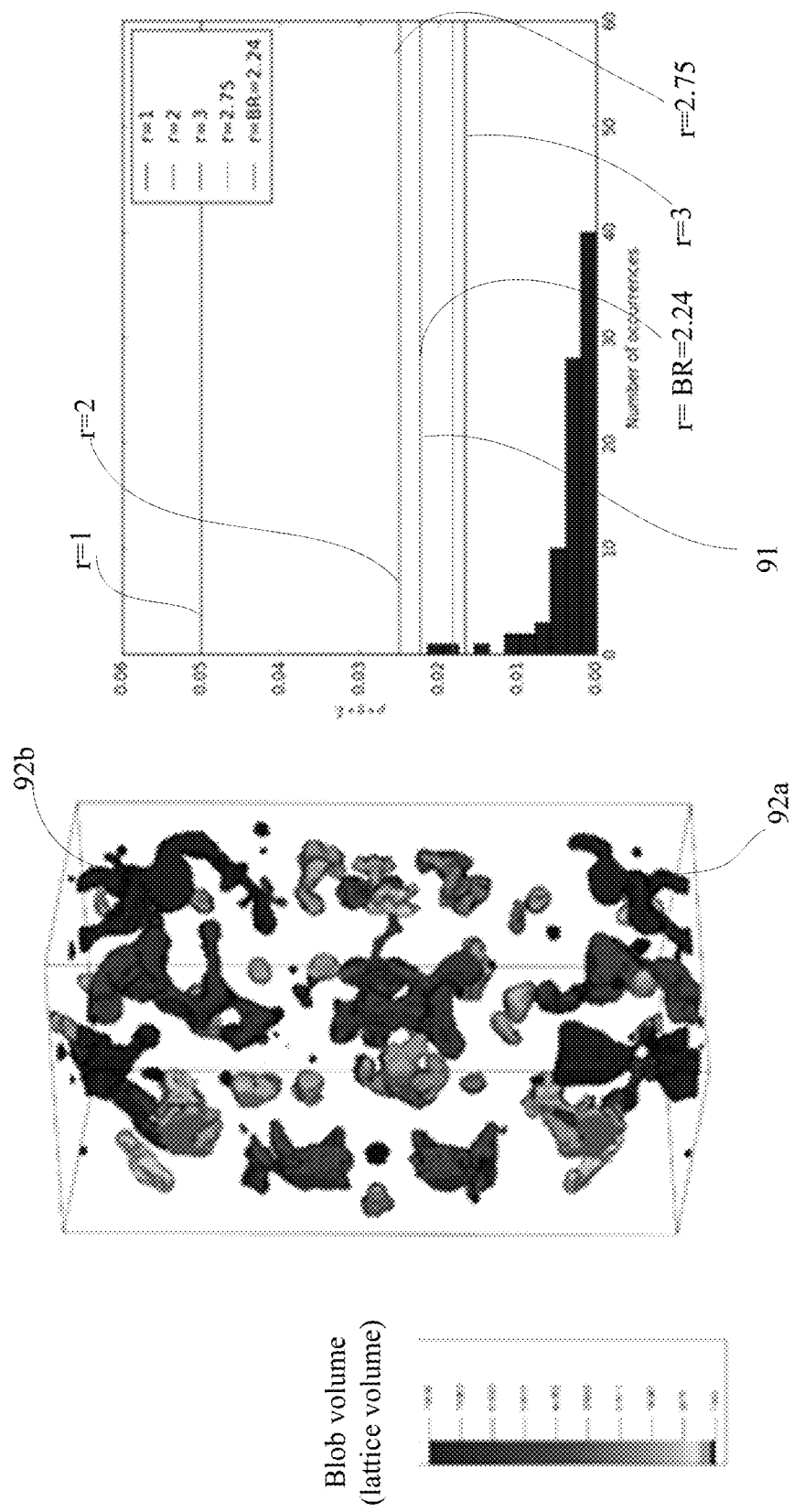
FIG. 9 is a visualization of blob volume and a plot of driving force of blobs based on blob length and number of blobs.

Referring now to FIG. 9, a visualization of blob volume (left) and a plot of driving force of blobs based on blob length and number of blobs (right) is shown. The pore geometry (pores in the rock) is not visualized. The number of blobs (bars) that are exposed to a certain driving force determined by the z-extension (blob length L) of those blobs. The driving force can be approximated with the product of blob length L, density of the fluid of the blob rho, and the driving force g (gravity). Fluids are driven by a body force g in z-direction (top-down). The horizontal lines represent the capillary forces for certain throat radii. The line 91 represents the capillary force needed to overcome the bottleneck pore throat size. There are no blobs where the driving force exceeds the capillary force needed to overcome the bottleneck pore throats.

Figure 10B:
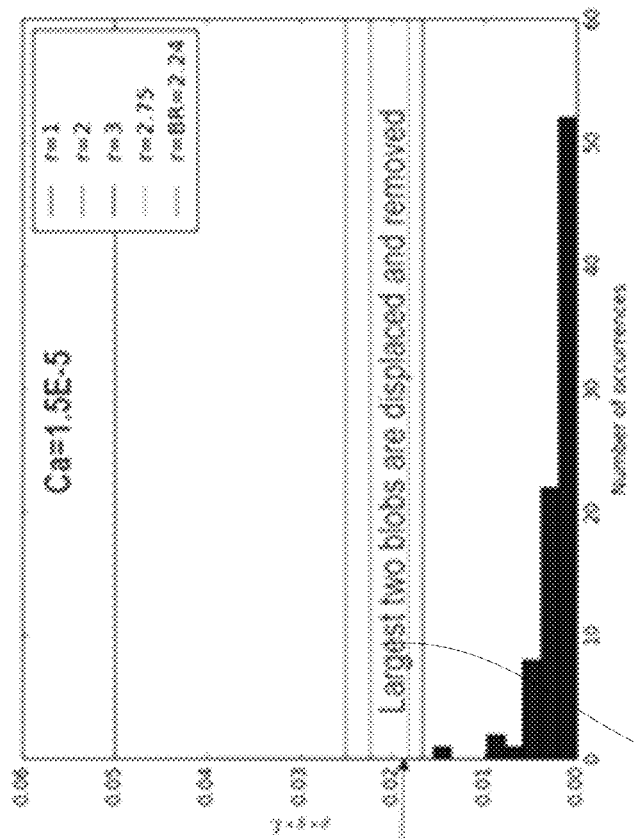
FIGS. 10A and 10B a bar charts for two Capillary numbers.
Figure 10A:
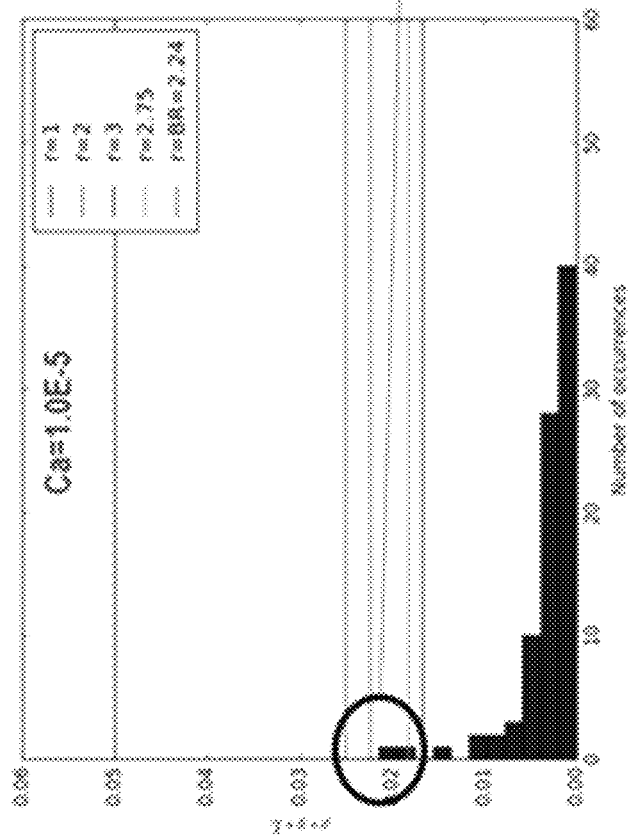

Referring now to FIGS. 10A and 10B, bar charts for two Capillary numbers show that the two largest blobs 92a, 92b (FIG. 9) that spanned across the periodic boundary conditions (top-down), and are represented in the bar chart at around $\rho*g*L=0.02$ (FIG. 10A) were removed. That these blobs were removed is illustrate by the absences of a blob (represented by bars in FIG. 10B) above line 91, which is the needed capillary pressure for the bottleneck radius. This is an indication that the trapping criterion holds for this example. In order to mobilize the two largest blobs 92a, 92b, the driving force (here body force) needs to be increased. This will result in a higher Capillary number, e.g., from the bar chart, and it can be seen that an increase of the body force (and consequently the Capillary number) by 50% will likely mobilize the two largest blobs.

Figure 11:
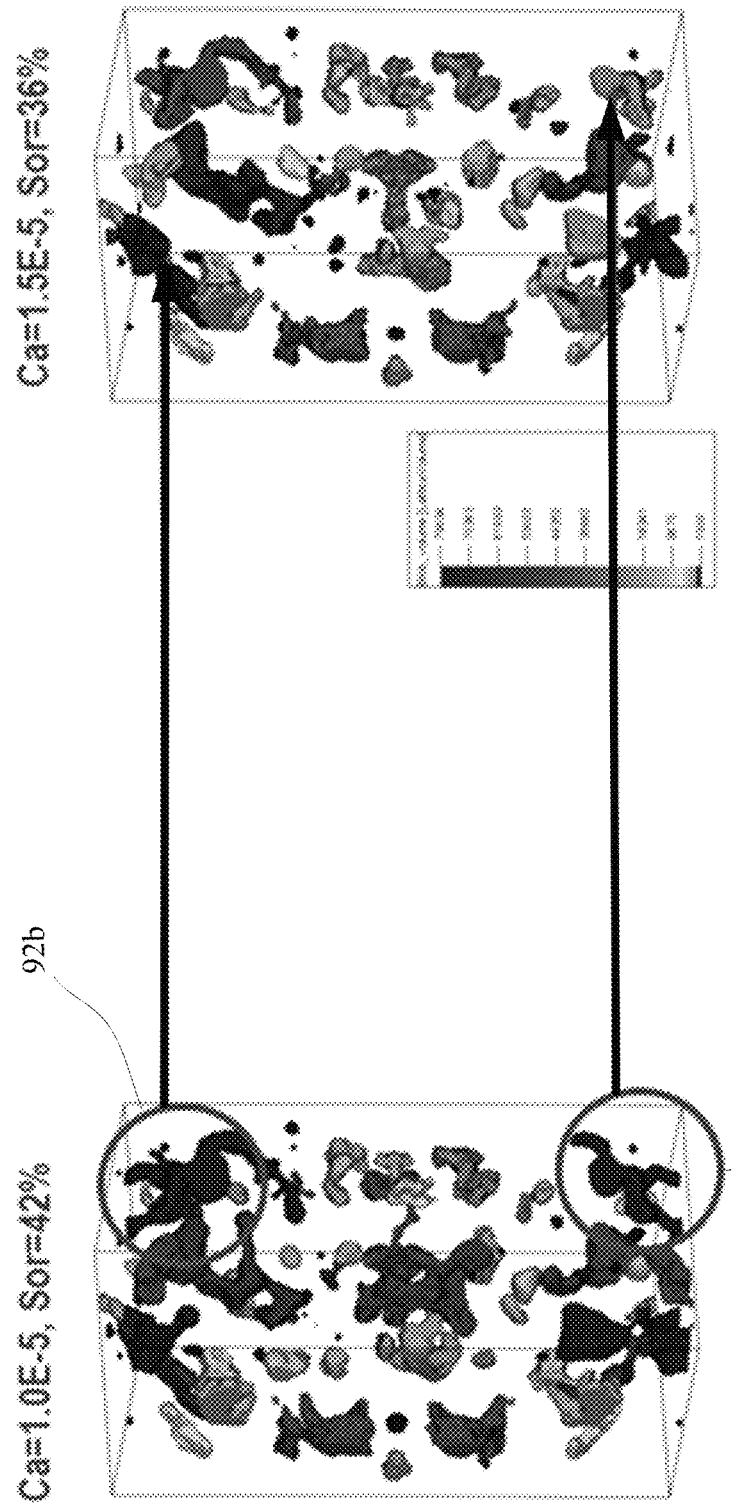
FIG. 11 depicts a comparison of oil blob volumes before and after mobilization.

Referring now to FIG. 11, a comparison of oil blob volumes before and after mobilization is shown. It can be seen that the two largest blobs 92a, 92b were mobilized as expected when the simulation was continued at a higher Capillary number of 1.5E-5. Comparing the two bar charts, it can be seen as well that the two largest blobs 92a, 92b did not just disappear, but instead, they split into several smaller blobs.

Again, at Ca=1.5E-5 no blobs with $\rho*g*L>0.02$ exist. Due to the mobilization, the residual oil saturation was reduced from 42% to 36%. It shall be noted that when an oil blob is mobilized, it does not necessarily require that the entire oil blob is recovered and thus removed from the pore space. Instead, it just indicates that the blob starts to move, and eventually undergoes a snap-off phenomena (splitting event). The resulting smaller blobs may travel to the next pore, merge with blobs downstream which may lead to consequential mobilization phenomena. An exact determination of how much oil is recovered due to increasing mobilization, while not a trivial determination, can be estimated based on correlations. Other approaches can use Machine Learning methods to associate pore space and oil blob topologies with a reduction of oil blob volume after mobilization. While the blob does not disappear, but instead splits into several smaller blobs, the blob accounts for some amount of oil that is actually recovered, thus removed from the pore space.

Determining blob states after mobilization are stored in a database of mobilization simulations. The database of mobilization simulations can be used to produce correlations (with or without usage of Machine Learning techniques) to provide estimates of an entire Capillary Desaturation Curve.

One approach to provide estimates of an entire Capillary Desaturation Curve is set out as follows:

The system 10 simulates a first kr curve for a certain Capillary number to provide the first point of the CDC curve. The first Capillary number is typically very small. The system 10 performs a pore scale analysis with respect to mobilization, and thus estimates a needed Capillary number to achieve a certain incremental oil production. This is the second point of the CDC curve. The system repeats the pore scale analysis to obtain a third point.

Another outcome of this type of pore scale analysis is that it can be seen whether the flow regime is within the Capillary number dominated regime based on how "close" the blobs are away from being produced. This occurs because every rock has a different specific critical Capillary number that defines the onset of mobilization. In summary, for example 2, the process applied is consistent with the process explained in the description of the basic concept.

Investigate the fluids and flow in the vicinity of a trapped blob: the pressure difference was measured (or here: assumed to be 0), the driving force on that blob was estimated using $\rho*g*L$. The pore space in the vicinity of the trapped blob was investigated: the pore throat radius was determined (here: the bottleneck radius was used) which is needed to estimate the resisting force. A relation in the form of a force balance was established to assess the criterion for mobilization. A method was proposed to estimate the amount of incremental oil produced, and to determine whether the displacement was operated above, below, or at the critical Capillary number (threshold of mobilization). Integrate mobilization efforts and incremental oil recovery for the entire domain.

Example 3: Pinned Oil (Patches)

When the grains prefer to be in contact with oil instead of water, and thus in an oil-wet rock, residual oil is often not located in the center of pore bodies, but rather is attached to a wall, often in the shape of a relatively thin patch. An oil patch may be completely trapped, through pinning, e.g. a transition of wettability or an oil patch may be very slowly produced through film flow. Both cases require a different mobilization mechanism. In the case of a pinned oil patch, a contact angle hysteresis has to be overcome. The driving force may result from a pressure drop and also from viscous forces from by-pass flow of the other fluid phase. The resisting force is due to the transition of contact angles—in some sense, this is also a capillary force.

The process to estimate an effort needed to overcome the pinning effect and therefore mobilize the oil blob/patch is substantially the same as that described for the basic concept and for example 2 above. The process includes investigating the fluids and flow in the vicinity of a trapped blob, investigate the pore space in the vicinity of the trapped blob, establish a force balance and thus a mobilization criterion, estimate the amount of incremental oil recovery and integrate mobilization efforts and incremental oil recovery for the entire domain Example 4: Oil Film In this scenario, the rock is oil-wet as well, but the oil patch is continuous, i.e., the oil patch is an oil film. In this scenario, trapping does not occur, but the oil recovery can be very slow and not economical. Instead of mobilization, it could be a goal to speed up the oil production so that the time scale of oil production replaces the term of incremental oil recovery. The process is identical as described above. Instead of optimizing the incremental oil recovery, the rate of incremental oil recovery is the optimizing feature of the EOR process employed.

Example 5: Diffusion—Oil in Dead-End Pore, or Oil in Oil-Wet Clay

There are many scenarios where oil is difficult to displace, simply because it is difficult to access (directly in contact) by the other fluid phase. This may be the case when oil is in a dead-end pore, or when oil is in an oil-wet clay. In such a scenario, gas injection may be the choice for an EOR method, and the displacement mechanism is diffusion of oil into the gas phase resulting in rich gas production. The mechanism is identical to the mechanism explained above.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs (also referred to as a data processing program) (i.e., one or more modules of computer program instructions, encoded on computer storage medium for execution by, or to control the operation of, data processing apparatus). A computer storage medium can be, or be included in, a computer-readable storage device, a computer-readable storage substrate, a random or serial access memory array or device, or a combination of one or more of them. The computer storage medium can also be, or be included in, one or more separate physical components or media (e.g., multiple CDs, disks, or other storage devices). The subject matter may be implemented on computer program instructions stored on a non-transitory computer storage medium.

The operations described in this specification can be implemented as operations performed by a data processing apparatus on data stored on one or more computer-readable storage devices or received from other sources.

The term "data processing apparatus" encompasses all kinds of apparatus, devices, and machines for processing data including, by way of example: a programmable processor, a computer, a system on a chip, or multiple ones, or combinations, of the foregoing. The apparatus can include special purpose logic circuitry (e.g., an FPGA (field programmable gate array) or an ASIC (application specific integrated circuit)). The apparatus can also include, in addition to hardware, code that creates an execution environment for the computer program in question (e.g., code that constitutes processor firmware, a protocol stack, a database management system, an operating system, a cross-platform runtime environment, a virtual machine, or a combination of one or more of them). The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry (e.g., an FPGA (field programmable gate array) or an ASIC (application specific integrated circuit)).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data (e.g., magnetic, magneto optical disks, or optical disks); however, a computer need not have such devices. Moreover, a computer can be embedded in another device (e.g., a mobile telephone, a personal digital assistant (PDA), a mobile audio or video player, a game console, a Global Positioning System (GPS) receiver, or a portable storage device (e.g., a universal serial bus (USB) flash drive)). Devices suitable for storing computer program instructions and data include all forms of non-volatile memory, media and memory devices including, by way of example, semiconductor memory devices (e.g., EPROM, EEPROM, and flash memory devices), magnetic disks (e.g., internal hard disks or removable disks), magneto optical disks, and CD ROM and DVD-ROM disks. The processor and the memory can be supplemented by, or incorporated in, special purpose logic circuitry.

To provide for interaction with a user, embodiments of the subject matter described in this specification can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback) and input from the user can be received in any form, including acoustic, speech, or tactile input. In addition, a computer can interact with a user by sending documents to and receiving documents from a device that is used by the user (for example, by sending web pages to a web browser on a user's user device in response to requests received from the web browser).

Embodiments of the subject matter described in this specification can be implemented in a computing system that includes a back end component (e.g., as a data server), or that includes a middleware component (e.g., an application server), or that includes a front end component (e.g., a user computer having a graphical user interface or a Web browser through which a user can interact with an implementation of the subject matter described in this specification), or any combination of one or more such back end, middleware, or front end components. The components of the system can be interconnected by any form or medium of digital data communication (e.g., a communication network). Examples of communication networks include a local area network ("LAN") and a wide area network ("WAN"), an internetwork (e.g., the Internet), and peer-to-peer networks (e.g., ad hoc peer-to-peer networks).

The computing system can include users and servers. A user and server are generally remote from each other and typically interact through a communication network. The relationship of user and server arises by virtue of computer programs running on the respective computers and having a user-server relationship to each other. In some embodiments, a server transmits data (e.g., an HTML page) to a user device (e.g., for purposes of displaying data to and receiving user input from a user interacting with the user device). Data generated at the user device (e.g., a result of the user interaction) can be received from the user device at the server.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can, in some cases, be excised from the combination, and the claimed combination may be directed to a sub combination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can to generally be integrated together in a single software product or packaged into multiple software products.

Thus, particular embodiments of the subject matter have been described. Other embodiments are within the scope of the following claims. For example, any of the above techniques that are described with reference to a pore space can also be performed with reference to or with regard to a physical media, such as a reservoir rock sample. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A computer implemented method for estimating amounts of hydrocarbon recoverable from porous reservoir rock by one or two or more enhanced oil recovery (EOR) techniques, the method comprising:
retrieving by a computing system a data structure holding a digital representation of a physical porous reservoir rock sample (porous reservoir rock), the digital representation including pore space and grain space data corresponding to the porous reservoir rock, subsequent to an execution of a multiphase flow simulation to obtain predictions of flow behavior of oil in the presence of a waterflood of the porous reservoir rock;
locating by the computing system substantially immobile oil blobs or patches in the retrieved, digital representation of the porous reservoir rock;
performing by the computer system on the immobile oil blobs, an analysis of a given one or more EOR techniques, with a first iteration of the given one or more EOR techniques expending a first level of effort, and a second iteration of the given one or more EOR techniques expending a second, higher level of effort; and for N number of substantially immobile oil blobs or patches (blobs),
determining by the computing system changes in the mobility of the blobs for the given one of the EOR techniques; and
producing by the computing system an estimate of an amount of change in mobilization of the blobs between the first and the second iterations for the given one or more EOR techniques.

2. The method of claim 1 further comprising:
performing by the computer system on the immobile blobs additional iterations at additional levels of effort;
integrating of all iterations at the additional levels of effort for the given one or more EOR techniques to provide an approximation of an incremental amount of oil recoverable oil for the one or more EOR techniques according to the levels of effort; and
producing for display on a display device associated with the computer, a comparison of oil blob volumes prior to and after mobilization of the blobs for the given one or more EOR techniques.

3. The method of claim 1 wherein the given EOR technique is a first EOR technique, and determining the changes in mobility of the blobs further comprises:
determining mobility of the blobs for two or more iterations of a second, different EOR technique, with a first one of the one or two or more iterations for the second EOR technique expending a first level of effort and a second one of the one or two or more iterations for the second, different EOR technique expending a second, higher level of effort, to estimate an amount of change in mobilization of the blob between the first and the second iterations for the second, different EOR technique.

4. The method of claim 3, further comprising:
producing determinations for each of the first and second EOR techniques based on the produced estimate to provide an approximation of an incremental amount of oil recoverable oil for the first and second EOR techniques.

5. The method of claim 4 wherein evaluating the blobs further comprises:
integrating of all iterations at different levels of effort including the first and second levels of effort, for each of the first and the second EOR techniques to provide an approximation of an incremental amount of oil recoverable oil for each of the first EOR technique and the second EOR technique according to the levels of effort.

6. The method of claim 1 wherein the blobs comprise connected oil phase regions and/or oil patches being oil attached to walls of the porous reservoir rock.

7. The method of claim 1 wherein effort comprises an increase in an amount of a parameter of the given EOR technique.

8. The method of claim 7 wherein effort comprises one or more of injection flow rate and type of injection surfactants.

9. The method of claim 3 wherein effort comprises an increase in an amount of a parameter of each of the first EOR technique and the second EOR technique applied to the porous reservoir rock.

10. The method of claim 9 wherein effort comprises one or more of injection flow rate and type of injection surfactants.

11. A system for estimating an amount of hydrocarbon recoverable from porous reservoir rock by a miscible gas flood, the system comprising:
one or more processor devices;
memory operatively coupled to the one or more processor devices; and
computer storage storing executable program instructions to cause the system to:
retrieve a data structure holding a digital representation of a physical porous reservoir rock sample (porous reservoir rock), the digital representation including pore space and grain space data corresponding to the porous reservoir rock, subsequent to an execution of a multiphase flow simulation to obtain predictions of flow behavior of oil in the presence of a waterflood of the porous reservoir rock;
locate substantially immobile oil blobs or patches in the retrieved, digital representation of the porous reservoir rock;
perform on the immobile oil blobs, an analysis of a given one or more EOR techniques, with a first iteration of the analysis for the given one or more EOR techniques expending a first level of effort, and a second iteration of the analysis for the given one or more EOR techniques expending a second, higher level of effort; and for N number of substantially immobile oil blobs or patches (blobs), and for N number of substantially immobile oil blobs or patches (blobs);
determine changes in the mobility of the blobs for the analysis for the given EOR technique; and
produce an estimate of an amount of change in mobilization of the blob between the first and the second iterations for the given one or more of the EOR techniques.

12. The system of claim 11, further configured to:
perform on the immobile oil blobs additional iterations at additional levels of effort; integrate of all iterations at the additional levels of effort for the given one or more of the EOR techniques to provide an approximation of an incremental amount of oil recoverable oil for the given one or more of the EOR techniques according to the levels of effort; and
produce for display on a display device associated with the system, a comparison of oil blob volumes prior to and after mobilization of the blobs for the given one or more EOR techniques.

13. The system of claim 11 wherein the given EOR technique is a first EOR technique, and the system is further configured to:

determine mobility of the blobs for two or more iterations of a second, different EOR technique, with a first one of the two or more iterations for the second EOR technique expending a first level of effort and a second one of the two or more iterations for the second, different EOR technique expending a second, higher level of effort, to estimate an amount of change in mobilization of the blob between the first and the second iterations for the second, different EOR technique.

14. The system of claim 13, further configured to:

integrate all iterations at different levels of effort including the first and second levels of effort, for each of the first and the second EOR techniques to provide an approximation of an incremental amount of oil recoverable oil for each of the first EOR technique and the second EOR technique according to the levels of effort.

15. The system of claim 13 wherein effort comprises an increase in an amount of a parameter of the given EOR technique.

16. The system of claim 11 wherein the numerical multiphase flow simulation is a first numerical multiphase flow simulation, with the system further configured to:

execute a second numerical multiphase flow simulation to obtain predictions of flow behavior for a gas flood of the porous reservoir rock.

17. A computer program product tangibly stored on a non-transitory storage device, for estimating an amount of hydrocarbon recoverable from porous reservoir rock by a miscible gas flood, the computer program product comprising instructions to cause a system to:

retrieve a data structure holding a digital representation of a physical porous reservoir rock sample (porous reservoir rock), the digital representation including pore space and grain space data corresponding to the porous reservoir rock, subsequent to an execution of a multiphase flow simulation to obtain predictions of flow behavior of oil in the presence of a waterflood of the porous reservoir rock;

locate substantially immobile oil blobs or patches in the retrieved, digital representation of the porous reservoir rock;

perform on the immobile oil blobs, an analysis of a given one or more EOR techniques, with a first iteration of the analysis for the given one or more EOR techniques expending a first level of effort, and a second iteration of the analysis for the given one or more EOR techniques expending a second, higher level of effort; and for N number of substantially immobile oil blobs or patches (blobs);

determine changes in the mobility of the blobs for the analysis for the given EOR technique; and produce an estimate of an amount of change in mobilization of the blob between the first and the second iterations for the given one or more of the EOR techniques.

18. The computer program product of claim 17, further comprising instructions to:

perform on the immobile oil blobs additional iterations at additional levels of effort;

integrate of all iterations at the additional levels of effort for the given one or more of the EOR techniques to provide an approximation of an incremental amount of oil recoverable oil for the given one or more of the EOR techniques according to the levels of effort; and produce for display on a display device associated with the system, a comparison of oil blob volumes prior to and after mobilization of the blobs for the given one or more EOR techniques.

19. The computer program product of claim 17, further comprising instructions to:

determine mobility of the blobs for two or more iterations of a second, different EOR technique, with a first one of the two or more iterations for the second EOR technique expending a first level of effort and a second one of the two or more iterations for the second, different EOR technique expending a second, higher level of effort, to estimate an amount of change in mobilization of the blob between the first and the second iterations for the second, different EOR technique; and integrate all iterations at different levels of effort including the first and second levels of effort, for each of the first and the second EOR techniques to provide an approximation of an incremental amount of oil recoverable oil for each of the first EOR technique and the second EOR technique according to the levels of effort.

20. The computer program product of claim 17, further comprising instructions to:

modify a level of effort by modifying one or more of injection flow rate and type of injection surfactants.

* * * * *